(12) United States Patent
Suda

(10) Patent No.: US 6,859,229 B1
(45) Date of Patent: Feb. 22, 2005

(54) IMAGE PICKUP APPARATUS

(75) Inventor: Yasuo Suda, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 750 days.

(21) Appl. No.: 09/604,745

(22) Filed: Jun. 28, 2000

(30) Foreign Application Priority Data

Jun. 30, 1999 (JP) .......................................... 11-185661

(51) Int. Cl.$^7$ ........................ H04N 3/14; H04N 5/335; H04N 9/04; H04N 9/083
(52) U.S. Cl. ........................ 348/273; 348/340; 348/342
(58) Field of Search ................................ 348/273, 335, 348/218.1, 340, 211, 211.1, 362; 358/44, 44.1

(56) References Cited

U.S. PATENT DOCUMENTS

| | | | |
|---|---|---|---|
| 3,304,435 A | 2/1967 | Norwood | 250/237 |
| 4,028,725 A | 6/1977 | Lewis | 348/115 |
| 4,724,354 A | 2/1988 | Dill | 313/371 |
| 4,790,632 A | 12/1988 | Miyakawa | 349/95 |
| 4,873,572 A | 10/1989 | Miyazaki | 348/45 |
| 4,920,395 A | 4/1990 | Muro | 357/30 |
| 5,255,088 A | * 10/1993 | Thompson | 348/90 |
| 5,262,819 A | 11/1993 | Ohtaka et al. | 354/402 |
| 5,565,914 A | * 10/1996 | Motta | 348/294 |
| 5,587,820 A | * 12/1996 | May et al. | 349/116 |
| 5,694,165 A | 12/1997 | Yamazaki et al. | 348/218 |
| 5,864,364 A | 1/1999 | Ohyama et al. | 348/211 |
| 6,157,420 A | * 12/2000 | Nakanishi et al. | 349/9 |
| 6,388,709 B1 | 5/2002 | Kobayashi | 348/362 |
| 6,560,018 B1 | 5/2003 | Swanson | 359/569 |

FOREIGN PATENT DOCUMENTS

| | | | |
|---|---|---|---|
| EP | 0 660 421 A2 | 6/1995 | |
| EP | 0 660 421 A3 | 6/1995 | |
| EP | 0 710 039 | 5/1996 | |
| EP | 0773673 | 5/1997 | .......... H04N/5/335 |
| EP | 0840502 | 5/1998 | .......... H04N/5/225 |
| EP | 0 896 480 | 2/1999 | |
| JP | 60-241277 | 11/1985 | |
| JP | 61-16580 | 1/1986 | |
| JP | 1-150372 | 6/1989 | |
| JP | 01-248542 | 10/1989 | |
| JP | 03-286566 | 12/1991 | |
| JP | 7-84177 | 3/1995 | ............ G02B/7/28 |
| JP | 7-123418 | 5/1995 | ............ H04N/9/04 |
| JP | 9-172649 | 6/1997 | ............ H04N/9/97 |
| JP | 9-284617 | 10/1997 | .......... H04N/5/225 |
| JP | 10-145802 | 10/1997 | ............ H04N/9/07 |
| WO | WO 93/11631 | 6/1993 | |
| WO | WO9311631 | * 6/1993 | .......... H04N/5/335 |

OTHER PUBLICATIONS

"Kogaku Gijutsu Handbook Zohoban" (Handbook of Optical Technology, Enlarged Edition), pp 172–174, 1975, Sakura Shoten.

European Search Report dated Mar. 25, 2004 (Ref. No. 2711330).

European Search Report Mar. 11, 2004 (Ref. No. 2728330).

* cited by examiner

*Primary Examiner*—Ngoc-Yen Vu
*Assistant Examiner*—Gary L Solomon
(74) *Attorney, Agent, or Firm*—Fitzpatrick, Cella, Harper & Scinto

(57) ABSTRACT

An image pickup apparatus comprises a plurality of openings for taking in external light at different positions, a filter(s) for extracting from external light taken in from the plurality of openings, predetermined wavelength components of subject light correspondingly to the plurality of openings, respectively, and a plurality of image pickup portions for receiving the predetermined wavelength components extracted by the filter correspondingly to the plurality of openings, respectively.

20 Claims, 12 Drawing Sheets

IMAGE PICKUP APPARATUS

BACKGROUND OF THE INVENTION

1. Field of the Invention

The present invention relates to an image pickup apparatus such as a video camera, capable of picking up a dynamic image or a still image.

2. Related Background Art

In a digital color camera, in response to depression of a RELEASE button, an image in a field is exposed onto a solid-state image pickup element, such as a CCD or a CMOS sensor, for a desired time period, an image signal obtained thereby and representing a still image of one picture is converted into a digital signal and is subjected to a predetermined processing, such as YC processing, and an image signal in a predetermined format is obtained. A digital image signal representing the picked-up image is recorded in a semiconductor memory on a picture-by-picture (frame) basis. The recorded image signal is read as desired and reproduced as a signal capable of being displayed or printed, and is output to a monitor or the like to be displayed.

As a technology for a digital color camera, one disclosed in Japanese Patent Application Laid-open No. 7-123418 is known. Japanese Patent Application Laid-open No. 7-123418 discloses that an object image on an estimated imaging plane is reimaged by a plurality of reimaging optical systems, with the respective object images being picked up through optical filters having different spectral transmission factor characteristics. This is suitable for obtaining a color image with high resolution using image pickup elements of a limited number of pixels.

However, the above structure has a disadvantage in that color misalignment of an object image is caused based on the imaging state of the object. This is caused because light beams of the plurality of reimaging optical systems are separated on the pupil of an objective lens. It also has a disadvantage in that the camera has to be made larger in order to reimage an image of an object.

SUMMARY OF THE INVENTION

According to one aspect of the present invention, there is provided an image pickup apparatus comprising a plurality of openings for taking in external light at different positions, a filter for extracting from external light taken in from the plurality of openings, predetermined wavelength components of object light respectively corresponding to the plurality of openings, and a plurality of image pickup portions for receiving the predetermined wavelength components extracted by the filter respectively corresponding to the plurality of openings. The image pickup apparatus of the present invention is small-sized, has a short image pickup optical path, and yet can obtain a desired color image.

Other aspects of the present invention will become apparent from the following preferred embodiments.

DESCRIPTION OF THE PREFERRED EMBODIMENTS

Preferred embodiments of the present invention are now described in detail with reference to the drawings.

Figure 17C:
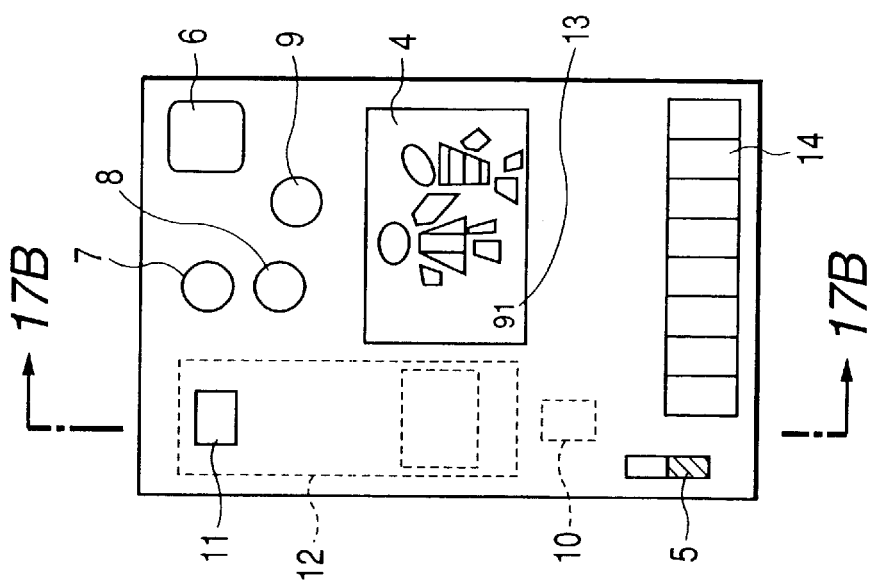
FIGS. 17A, 17B, and 17C illustrate the overall structure of the digital color camera shown in FIG. 1.
Figure 17B:
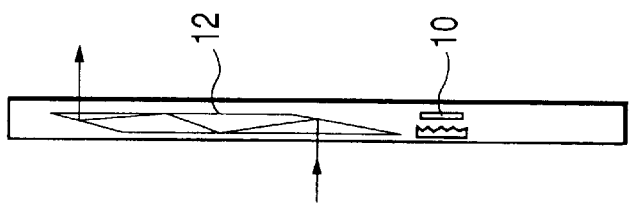
Figure 17A:
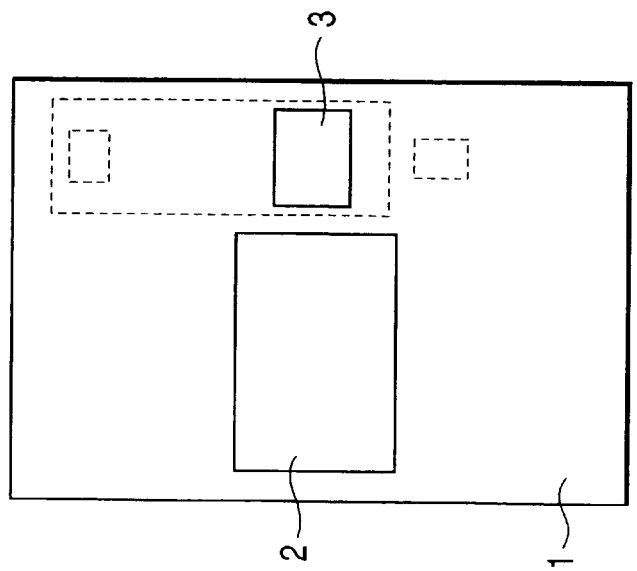

FIGS. 17A, 17B, and 17C illustrate the overall structure of a digital color camera according to a first embodiment of the present invention. FIGS. 17A, 17C, and 17B are a front view, a rear view, and a sectional view taken along the line 17B—17B in the rear view of FIG. 17C, respectively.

In FIGS. 17A, 17B, and 17C, reference numeral 1 denotes a camera body. An illuminating light intake window 2 formed of a white diffusing plate is positioned at the back of a color liquid crystal monitor 4. Reference numerals 5 and 6 denote a main switch and a RELEASE button, respectively. Reference numerals 7, 8, and 9 are switches for a user to set the state of the camera. In particular, the reference numeral 9 denotes a PLAY button. A reference numeral 13 denotes a display of the remaining number of recordable pictures. Object light which is incident into a prism 12 from a viewfinder front frame 3 is projected from a viewfinder eyepiece window 11. Reference numerals 10 and 14 denote an image pickup system and a connection terminal for connecting to an external computer or the like to transmit and receive data, respectively.

Figure 14:
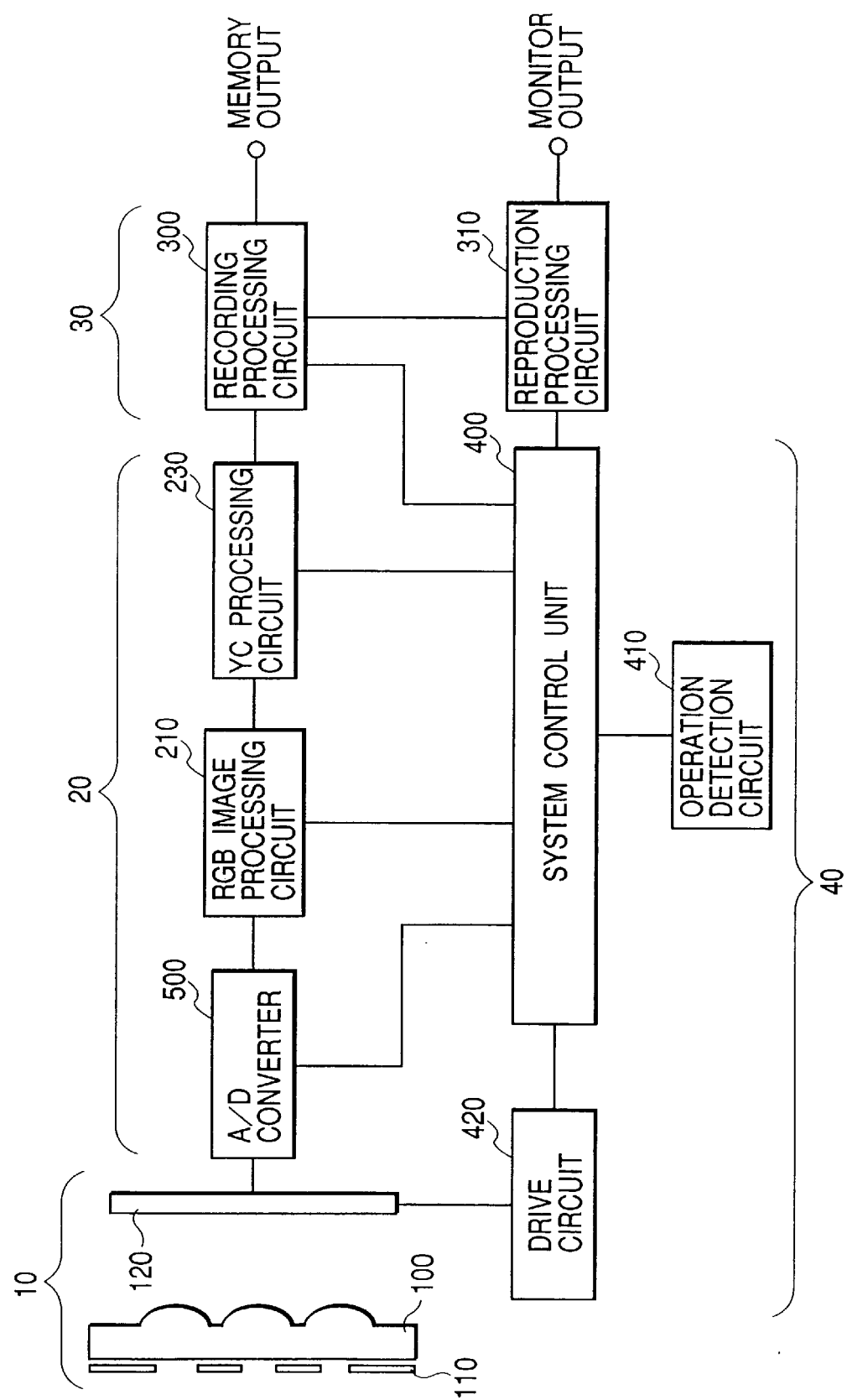
FIG. 14 is a block diagram of a signal processing system of the digital color camera shown in FIG. 1.

The schematic structure of a signal processing system is now described. FIG. 14 is a block diagram of the signal processing system. This camera is a single plate type digital color camera using a solid-state image pickup element 120 such as a CCD or a CMOS sensor. Image signals representing a dynamic image or a still image are obtained by driving the solid-state image pickup element 120 continuously or only once. Here, the solid-state image pickup element 120 is an image pickup device of the type which converts exposure light into electric signals with regard to the respective pixels, stores respective charges according to the light amount, and reads the respective charges.

It is to be noted that FIG. 14 only shows portions which are directly relevant to the present invention, and illustration and description of portions which are not directly relevant to the present invention are omitted.

As shown in FIG. 14, the image pickup apparatus has the image pickup system 10, an image processing system 20 as image processing means, a recording and reproduction system 30, and a control system 40. Further, the image pickup system 10 includes therein an objective lens 100, a diaphragm 110, and the solid-state image pickup element 120; the image processing system 20 includes therein an A/D converter 500, an RGB image processing circuit 210, and a YC processing circuit 230; the recording and reproduction system 30 includes therein a recording processing circuit 300 and a reproduction processing circuit 310; and the control system 40 includes therein a system control unit 400, an operation detection circuit 410, and a drive circuit 420 of the solid-state image pickup element.

The image pickup system 10 is an optical processing system for imaging light received from an object through the diaphragm 110 and the objective lens 100, and incident on an image pickup plane of the solid-state image pickup element. The light transmission factor of the objective lens 100 is adjusted to expose a subject image of an appropriate light amount onto the solid-state image pickup element 120. As described above, as the solid-state image pickup element 120, an image pickup device such as a CCD or a CMOS sensor is applied. By controlling the exposure time and the exposure intervals of the solid-state image pickup element 120, image signals representing continuous dynamic images or image signals representing a still image by one exposure can be obtained.

Figure 1:
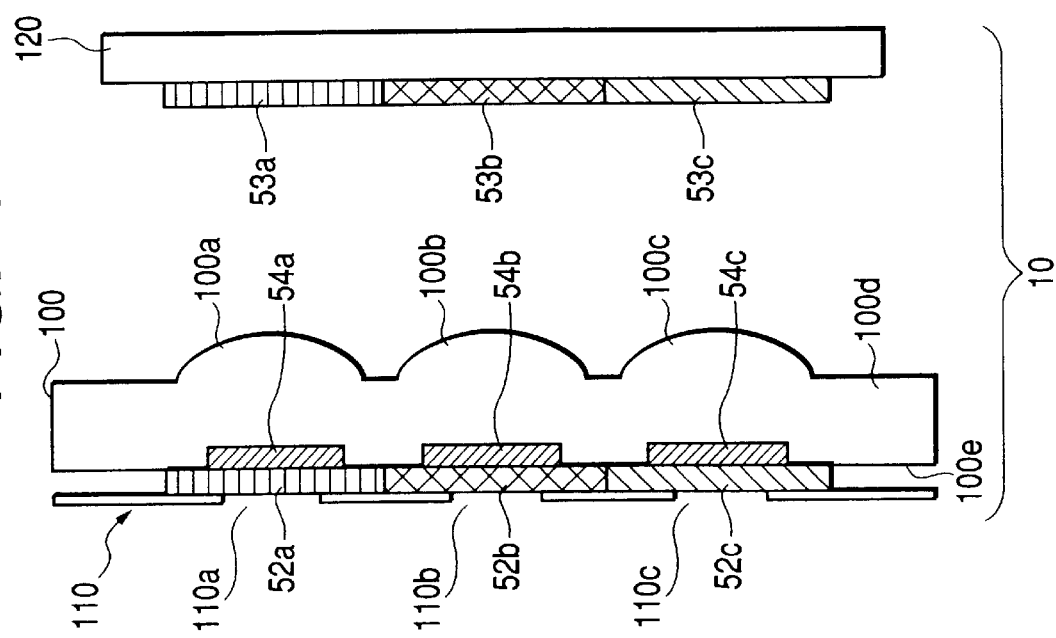
FIG. 1 is a sectional view of an image pickup system of a digital color camera according to an embodiment of the present invention.
Figure 3:
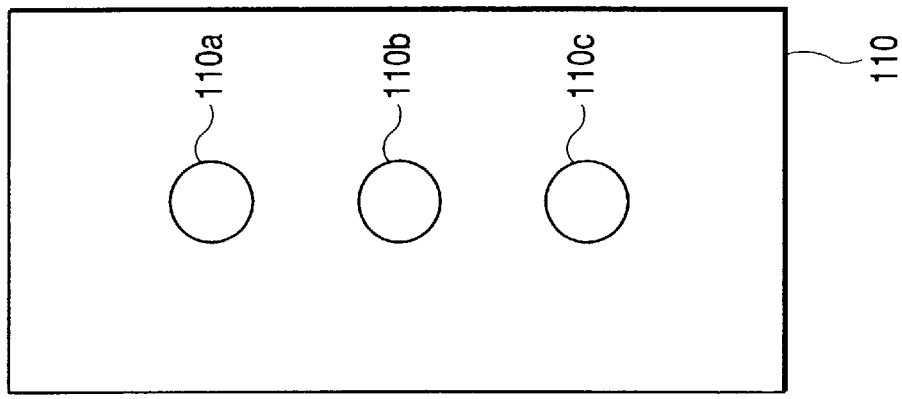
FIG. 3 is a plan view of a diaphragm of the image pickup system shown in FIG. 1.

FIG. 1 is a detailed view of the image pickup system 10. First, the diaphragm 110 has three circular openings 110a, 110b, and 110c, as shown in FIG. 3. Object light which enters a light incidence plane 100e of the objective lens 100 from the openings is projected from three lens portions 100a, 110b, and 100c of the objective lens 100 to form three object images on the image pickup plane of the solid-state image pickup element 120. The diaphragm 110, the light incidence plane 100e, and the image pickup plane of the solid-state image pickup element 120 are provided in parallel with one another. In this way, by making the power on the incidence side weak, making the power on the projection side strong, and providing a diaphragm on the incidence side, the curvature of the image plane can be reduced. It is to be noted that, though the light incidence plane 100e of the objective lens 100 is a plane here, the light incidence plane 100e may be formed by three spherical surfaces or three rotation-symmetry nonspherical surfaces.

Figure 5:
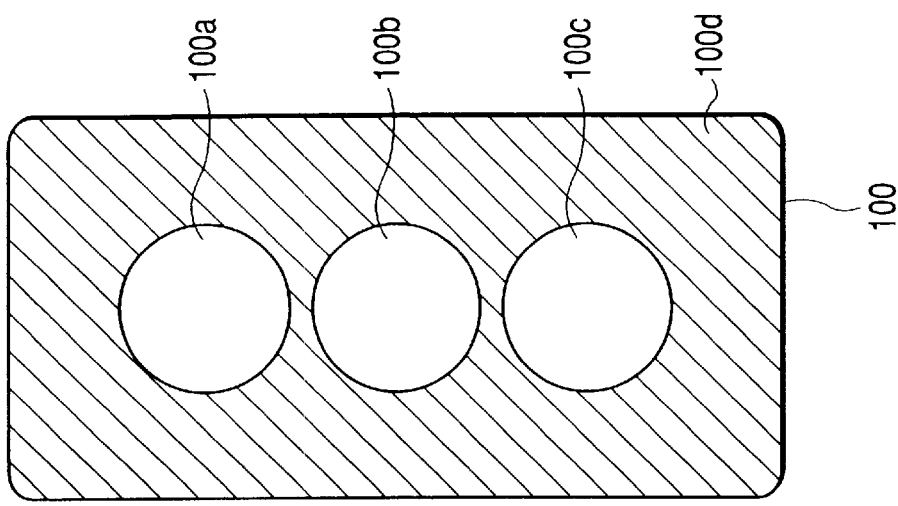
FIG. 5 illustrates an objective lens of the image pickup system shown in FIG. 1 which is viewed from the side where light is projected.

The three lens portions 100a, 110b, and 100c have circular spherical surface portions, as shown in FIG. 5, which illustrates the objective lens 100 viewed from the side where light is projected. An infrared radiation cutting filter having a low transmission factor with regard to a wavelength range of 670 nm and greater is formed on the spherical surface portions, while a light-shielding layer is formed on a plane portion 100d shown with hatching. More specifically, the objective optical system is formed by the objective lens 100 and the diaphragm 110, while the three lens portions 100a, 100b, and 100c form the imaging system.

The manufacturing is made easy by using glass molding in the case where the objective lens 100 is made of glass, and by using injection molding in the case where the objective lens 100 is made of resin.

Figure 2:
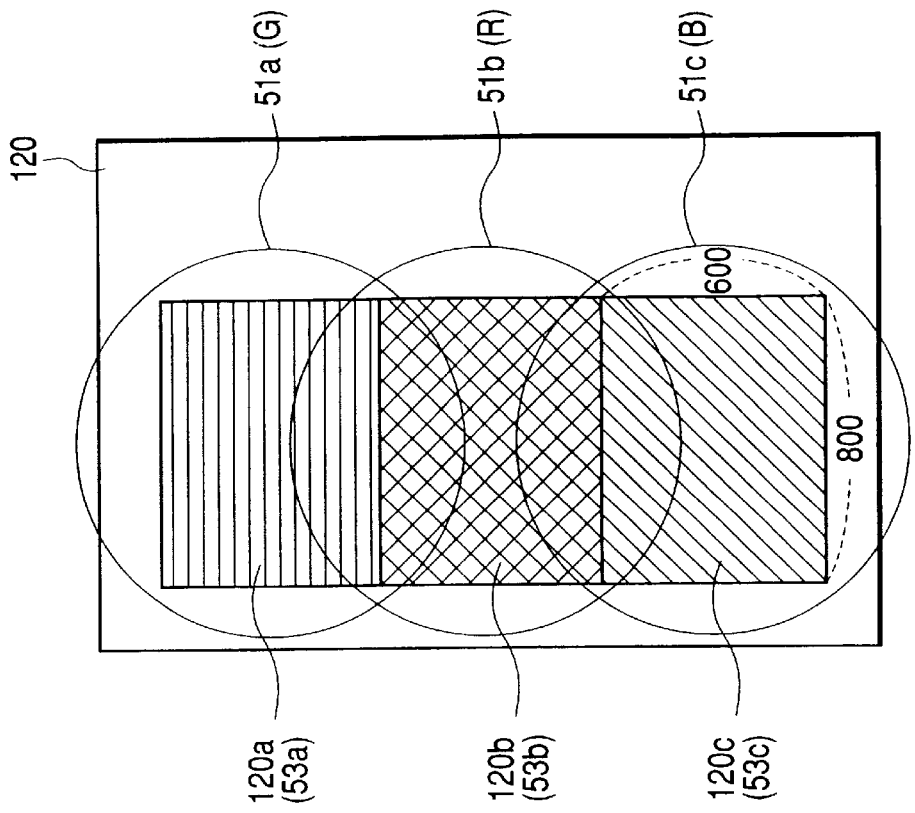
FIG. 2 is a front view of a solid-state image pickup element of the image pickup system shown in FIG. 1.

FIG. 2 is a front view of the solid-state image pickup element 120. The solid-state image pickup element 120 is provided with three image pickup regions 120a, 120b, and 120c corresponding to the three object images formed by objective lens. Each of the image pickup regions 120a, 120b, and 120c are sized to be 2.24 mm×1.68 mm with the arrangement of 800×600 pixels having vertical and horizontal pitches of 2.8 µm. The size of the overall image pickup region is 2.24 mm×5.04 mm. The diagonal size of each of the image pickup regions is 2.80 mm. In FIG. 2, image circles 51a, 51b, and 51c, within each of which an object image is formed, are circular, the sizes of which circles are determined by the size of the openings of the diaphragm and the spherical surface portions on the projection side of the objective lens 100. The image circles 51a and 51b overlap each other and the image circles 51b and 51c overlap each other.

Figure 4:
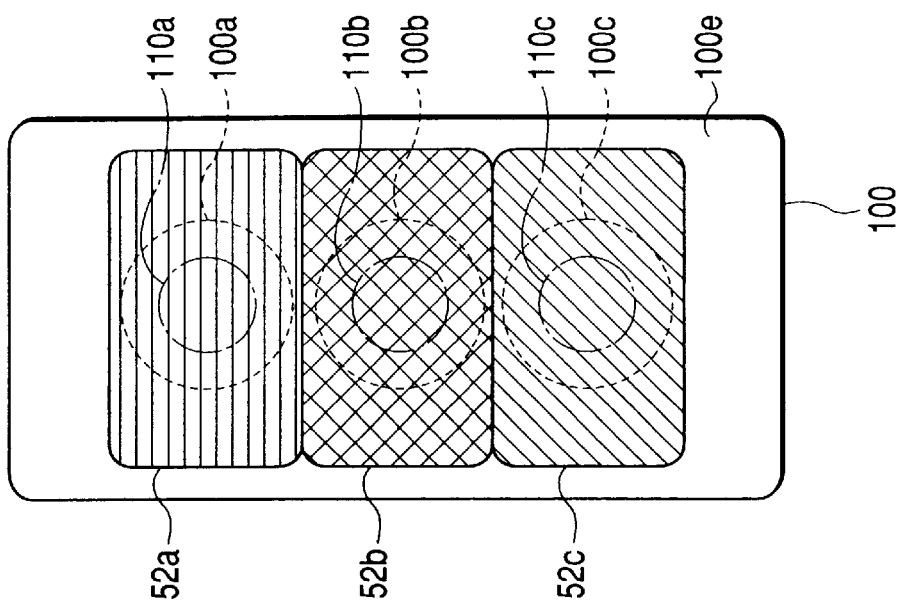
FIG. 4 illustrates the ranges where optical filters of the image pickup system shown in FIG. 1 are formed.

In FIG. 1, hatched portions 52a, 52b, and 52c sandwiched between the diaphragm 110 and the objective lens 100 are optical filters formed on the light incidence plane 100e of the objective lens 100. As shown in FIG. 4, which illustrates the objective lens 100 viewed from the light incidence side, the optical filters 52a, 52b, and 52c are formed in regions which completely include the diaphragm openings 110a, 110b, and 110c, respectively.

Figure 6:
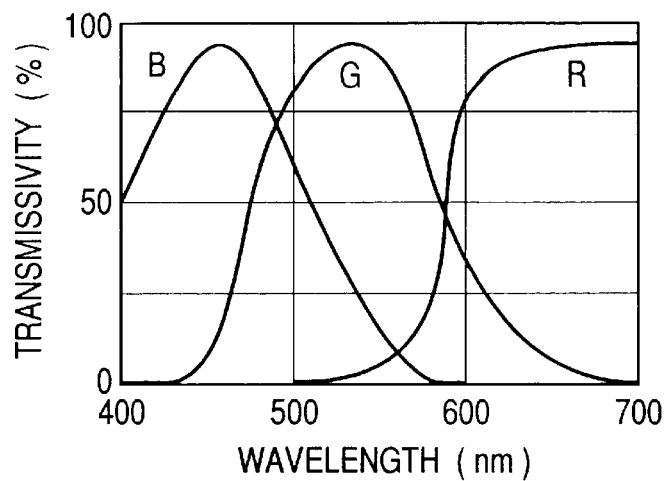
FIG. 6 is a graph showing the spectral transmission factor characteristics of the optical filters of the image pickup system shown in FIG. 1.

The optical filter 52a has spectral transmission factor characteristics shown as G in FIG. 6, that is, mainly transmitting green; the optical filter 52b has spectral transmission factor characteristics shown as R, that is, mainly transmitting red; and the optical filter 52c has spectral transmission factor characteristics shown as B, that is mainly transmitting blue; thus, these are primary color filters. As the product with the characteristics of the infrared radiation cutting filter formed on the lens portions 100a, 100b, and 100c, the object images formed in the image circles 51a, 51b, and 51c are of green light component, red light component, and blue light component, respectively.

On the other hand, optical filters 53a, 53b, and 53c are formed on the three image pickup regions 120a, 120b, and 120c, respectively, of the solid-state image pickup element 120. Their spectral transmission factor characteristics are equivalent to the ones shown in FIG. 6. More specifically, the image pickup regions 120a, 120b, and 120c are sensitive to green light (G), red light (R), and blue light (B), respectively.

Since the spectral distributions of the received light of the respective image pickup regions are given as the product of the spectral transmission factors of the pupils and the spectral transmission factors of the image pickup regions, respectively, each combination of a pupil and an image pickup region is selected according to the wavelength range. More specifically, object light which goes through the diaphragm opening 110a is mainly photoelectrically converted in the image pickup region 120a, object light which goes through the diaphragm opening 110b is mainly photoelectrically converted in the image pickup region 120b, and object light which goes through the diaphragm opening 110c is mainly photoelectrically converted in the image pickup region 120c. In other words, the image pickup regions 120a, 120b, and 120c output a G image, an R image, and a B image, respectively. In this way, by using multiple optical filters for the purpose of color separation on the pupils of the image pickup optical system and on the image pickup element, the color purity can be enhanced. This is because, by using the same kind of optical filters twice, the buildup of the transmission factor characteristics becomes steeper and the red color (R) and the blue color (B) do not overlap each other. It is to be noted that the transmission factors of the optical filters 52a, 52b, and 52c or of the optical filters 53a, 53b, and 53c are preferably set so as to provide appropriate signal levels in the respective image pickup regions in the same accumulation time.

In the image processing system 20, a color image is formed based on the selective photoelectric conversion output obtained from the plurality of images by the plurality of image pickup regions of the solid-state image pickup element 120, respectively. Here, since the peak wavelength of the spectral luminous efficiency is 555 nm, the signal processing is carried out using a G image signal including this wavelength, as the reference image signal.

When the pixel pitch of the solid-state image pickup element is fixed, compared with a system adopted generally by a digital color camera in which an RGB color filter is formed on the solid-state image pickup element with, for example, 2×2 pixel block basis to provide wavelength selectability to each pixel, and thus, an object image is separated into RGB images, the size of the object image is $1/\sqrt{3}$ times, and thus, the focal length of the objective lens is about $1/\sqrt{3}$ times, which is quite advantageous in thinning the camera.

It is to be noted that, with regard to the spectral transmission factor characteristics of the optical filters 52a, 52b, and 52c and of the optical filters 53a, 53b, and 53c, as shown in FIG. 6, R and G overlap each other and G and B overlap each other, though R and B are almost separated from each other. Therefore, even when the image circle 51b of the red light overlaps the image pickup region 120c for photoelectrically converting the blue light, and conversely, even when the image circle 51c of the blue light overlaps the image pickup region 120b for photoelectrically converting the red light, these images do not become the output of the image pickup regions. However, at the portion where the image circle 51b of the red light overlaps the image pickup region 120a for photoelectrically converting the green light and at the portion where the image circle 51a of the green light overlaps the image pickup region 120b for photoelectrically converting the red light, a small amount of an image of a different wavelength which should be blocked is superimposed. More specifically, since the selectivity of the object image is given by the product of the spectral transmission factor characteristics of the optical filter 52a and the spectral transmission factor characteristics of the optical filter 53b, and by the product of the spectral transmission factor characteristics of the optical filter 52b and the spectral transmission factor characteristics of the optical filter 53a, the cross talk of the R image signal and the G image signal does not become zero, although it is small.

Therefore, the objective lens 100 is further provided with characteristics to lower the transmission factor of the wavelength range of the portion where R and G overlap each other. This can be carried out by using optical filtering technology implemented by a color purity correction filter.

The color purity correction filter is an optical filter formed of a base material made of a transparent synthetic resin or glass having a predetermined amount of rare-earth metal ions contained therein.

As the rare-earth metal ions, one or more selected among neodymium ions, praseodymium ions, erbium ions, and holmium ions are used. However, it is preferable that at least neodymium ions are used as indispensable ions. It is to be noted that trivalence ions are generally used as these ions. The content of the metal ions is selected in a range of normally 0.01 to 40 mass parts, preferably 0.04 to 30 mass parts relative to 100 mass parts of the base material of the objective lens 100.

Figure 7:
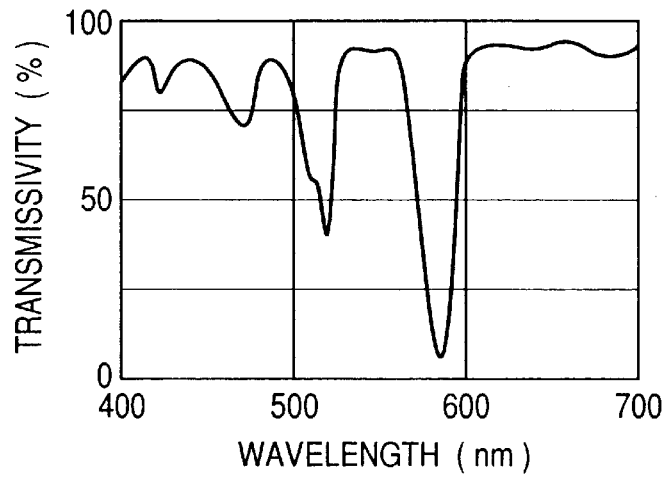
FIG. 7 is a graph showing the spectral transmission factor characteristics of a color purity correction filter of the image pickup system shown in FIG. 1.

As shown in FIG. 7, the color purity correction filter has characteristics to selectively absorb light in a predetermined wavelength range between the peak wavelengths of the color components of R, G, and B, to decrease the amount of transmission thereof. This action almost eliminates cross talk due to the overlap of the image circle 51b of the red light and the image pickup region 120a for photoelectrically converting the green light, and the overlap of the image circle 51a of the green light and the image pickup region 120b for photoelectrically converting the red light.

Further, the objective lens 100 is also provided with photochromic characteristics, which is a phenomenon to be darkened by light and to be reversibly achromatized when the irradiation of light is stopped. The reason for this is, since the accumulation time control range of the solid-state image pickup element 120 is limited, to suppress the amount of light reaching the solid-state image pickup element when the field is extremely bright, thereby enlarging the recordable intensity range.

As the photochromic glass, for example, photochromic glass of phosphate glass made by Chance-Pilkington, which has been put to practical use for spectacles (Product name: Reactolite Rapide), may be used.

Figure 8:
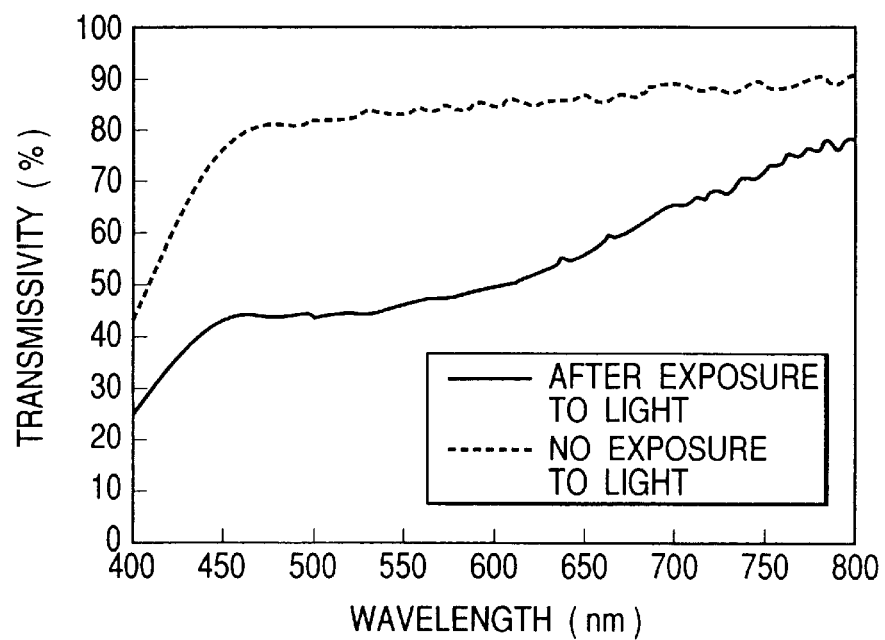
FIG. 8 is a graph showing the spectral transmission factor characteristics of a photochromic glass of the image pickup system shown in FIG. 1.

FIG. 8 is a graph showing the spectral transmission factor characteristics of a photochromic glass used as the objective lens 100. In FIG. 8, a solid line shows the characteristics after exposure to sunlight for 20 minutes, while a broken line shows the characteristics with no exposure to sunlight. When the camera is carried about with the user outdoors under a blue sky or the like, light beams which enter the objective lens 100 from the diaphragm 110 make the objective lens 100 itself darken so as to suppress the amount of light entering the solid-state image pickup element 120 by about ½. As a result, the accumulation time can be made twice as long, which raises the control limitation on the high intensity side.

The screen size of each of the image pickup regions 120a, 120b, and 120c is 2.24 mm×1.68 mm, as described above, since the pixel pitch is 2.8 μm and the number of the pixels is 800×600. The diagonal screen size of each of the image pickup regions is 2.80 mm. Generally, when the image pickup angle θ of a small-sized camera is about 70° in the diagonal direction, the camera is most convenient. When the image pickup angle is 70°, the focal length is 2.0 mm in this case, since it is determined by the diagonal size of the screen.

When a person or the like is the subject of recording, considering that a person is about 170 cm tall and one person to three people are often recorded at a time, a virtual distance D to the subject [m] can be defined as in the following equation (1) as a function of the image pickup angle θ[°]:

$$D=1.4/\tan(\theta/2) \qquad (1)$$

Substituting 70° for θ in equation (1), D=2.0 m is obtained. Here, if the image pickup system 10 is formed so as to focus on the subject best when the distance to the subject is 2 m, the letting out of the lens from the point at infinity is 0.002 mm. Taking into consideration the allowable circle of confusion to be described later, practically no problems are created even if the image pickup system is a fixed focus image pickup optical system without a mechanism for letting the lens out.

A focal length f of a planoconvex lens disposed in air can be represented as follows:

$$f=\{1/(1-n)\}r \qquad (2)$$

wherein n is the index of refraction and r is the radius of the spherical surface. Therefore, if the index of refraction n of the objective lens 100 is 1.5, for example, r for obtaining the focal length of 2.0 mm is 1.0 mm.

It is convenient to make equal the sizes of the red, green, and blue object images, since there is no need to make correction of the image magnification, and thus, the processing time is not elongated. Therefore, the lens portions 100a, 100b, and 100c are optimized for the peak wavelengths of 530 nm, 620 nm, and 450 nm of the light which respectively goes through the RGB optical filters, so as to make equal the magnifications of the respective images. This can be paraxially materialized by making equal the distance from the positions of the principal points of the respective lens portions to the solid-state image pickup element.

In the case of glass, which has an index of refraction of the d line (587.6 nm) $n_d$=1.5 and an Abbe number $V_d$=60, the indexes of refraction at the wavelengths of 530 nm, 620 nm, and 450 nm are about 1.503, 1.499, and 1.509, respectively. If all the radii r of the spherical surfaces of the lens portions 100a, 100b, and 100c equal −1.0 mm, the focal lengths at the respective wavelengths are, by equation (2), as follows:

a lens portion 100a having the representative wavelength of 530 nm:1.988 mm, a lens portion 100b having the representative wavelength of 620 nm:2.004 mm, and a lens portion 100c having the representative wavelength of 450 nm:1.965 mm.

Suppose from the pixel pitch that the allowable circle of confusion is 3.0 μm, and further suppose that the f-number of the objective lens is F5.6, then the depth of focus represented as the product of the two is 16.8 μm. It can be seen that the difference 0.039 mm between the focal length in the case of 620 nm and the focal length in the case of 450 nm already exceeds this. More specifically, though the paraxial image magnifications are the same, depending on the color of the subject, the subject may be out of focus. Since the spectral transmission factor of an object normally ranges over a wide wavelength range, it is quite rare that a sharp image in focus can be obtained.

Accordingly, the radii r of the spherical surfaces of the lens portions 100a, 100b, and 100c are optimized with regard to the respective representative wavelengths. More specifically, here, no achromatism for removing the chromatic aberration over the overall visible region is carried out, and designs for the wavelengths are applied to the respective lenses. First, the equation (2) is transformed to obtain the following equation (3):

$$r=(1-n)f \qquad (3)$$

Inserting f=2.0 and inserting in sequence n=1.503, n=1.499, and n=1.509 in equation (3), the following respective radii are calculated:

a lens portion 100a having the representative wavelength of 530 nm:r=−1.006 mm, a lens portion 100b having the representative wavelength of 620 nm:r=−0.998 mm, and a lens portion 100c having the representative wavelength of 450 nm:r=−1.018 mm.

In order to make well-balanced the difference in the image magnifications at a high position of an image, the heights of the vertices of the lens portions 100a, 100b, and 100c are slightly adjusted, and then, both the sharpness and the image magnification are ideal. Further, non-spherical surfaces are used for the respective lens portions to satisfactorily correct the curvature of the image plane. With regard to the distortion of the image, it can be corrected in the signal processing to be carried out later.

In this way, when reference G image signals having a green object light including the wavelength of 555 nm, which has the highest luminosity factor, and image signals having red and blue object lights, respectively, are obtained, and different focal lengths are set with regard to one wavelength and a substantially equal focal length is set with regard to the representative wavelengths in the respective spectral distribution in the imaging system, then by compositing these image signals, a color image with satisfactory correction of the chromatic aberration can be obtained. Since each of the imaging systems is formed of one lens, there also can be attained the technological advantage of thinning the imaging system. Further, though achromatism normally requires a combination of two lenses having different dispersions, the achromatism is carried out here by only one lens, and thus, there also can be attained the technological advantage of lowering the cost.

The objective lens 100 is required to have high contrast image dissection up to a spatial frequency range as high as the pixel pitch. The image pickup system 10 takes in three object images with regard to the three wavelength ranges, and thus, compared with an image pickup system provided with a mosaic optical filter, such as of the Bayer arrangement, having the same number of pixels, as described above, the required focal length is about $1/\sqrt{3}$ times to attain the same image pickup angle. Therefore, it is necessary to materialize high contrast image dissection of higher spatial frequency component. The optimization with regard to the respective wavelengths of the lens portions described above is a technology for suppressing the chromatic aberration for the purpose of materializing this.

Generally, there are two methods of improving the aberration characteristics of an image pickup optical system to make spurious resolution less liable to occur, thereby alleviating problems: one is to increase the degree of freedom in designing by, for example, increasing the number of lenses forming the system, by making the lenses nonspherical, using anomalous dispersion glass, or by complexly using diffraction optical elements; and the other is to make narrower the imaging light beam.

The former method, that is, increasing the degree of freedom in designing, though the focal length is $1/\sqrt{3}$ times, tends to make the structure of the objective optical system more complex, which goes against thinning of the image pickup apparatus, and thus, is inappropriate. On the other hand, the latter method, that is, use of a narrower light beam, conforms to a thin image pickup apparatus.

Figure 10:
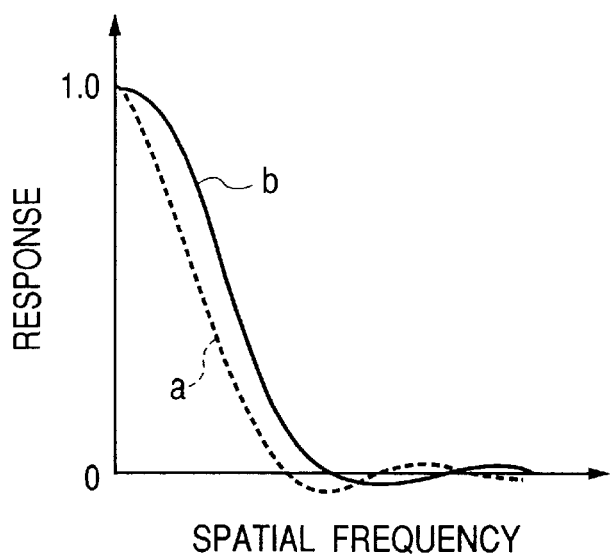
FIG. 10 is a graph showing the OTF characteristics of the objective lens of the image pickup system shown in FIG. 1.

When an imaging light beam is made narrower, as shown by a solid line b in FIG. 10, the response function referred to as OTF presents gradual monotone decrease in the low frequency component, and after that, becomes slightly negative, and then, becomes slightly positive. On the other hand, in the case where a broad light beam without narrowing is used, as shown by a broken line a in FIG. 10, the response function presents steep decrease in the low frequency component, and after that, becomes temporarily negative, and then, becomes positive again.

The state where the OTF is negative indicates occurrence of spurious resolution. This corresponds to an actual state where reversal of negative/positive occurs, that is, a portion which should be white is black while a portion which should be black is white. It makes it clear that a natural image can be obtained by making narrower the imaging light beam.

However, when the imaging light beam is extremely narrowed, the contrast in a high frequency range is decreased due to diffraction of light. In this state, an image is formed having of a bright spot at the center and diffraction stripes surrounding the bright spot. These are caused by, as is known well, relative increase in the intensity of the diffraction stripes due to peripheral waves generated on the periphery of the opening of the diaphragm.

The diffraction stripes can be decreased by adding to the objective lens a filter which is transparent at the center and becomes darker toward the periphery. This method is referred to as apodization, which is described in detail on pages 172 to 174 of "Kogaku Gijutsu Handbook Zohoban (Handbook of Optical Technology, Enlarged Edition)" (1975, Asakura Shoten).

Figure 9:
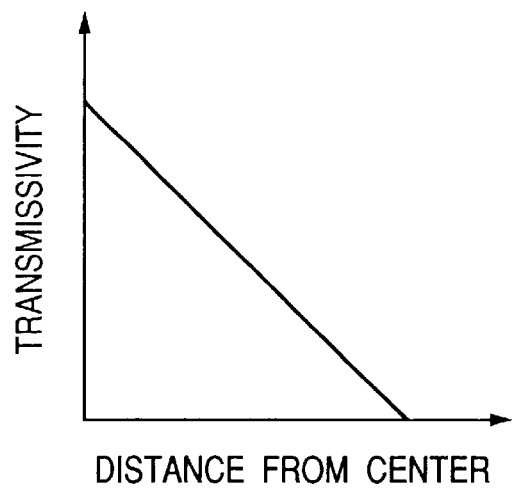
FIG. 9 is a graph showing the transmission factor distribution of a transmission factor distribution type filter of the image pickup system shown in FIG. 1.

FIG. 9 is a graph showing the transmission factor distribution of transmission factor distribution type filters provided on the light incidence plane 100e of the objective lens 100 so as to face the diaphragm openings 110a, 110b, and 110c. The transmission factor distribution type filters are denoted as 54a, 54b, and 54c in FIG. 1. The positions where the transmission factor is the highest correspond to the centers of the diaphragm openings 110a, 110b, and 110c, while the positions where the transmission factor is zero correspond to the periphery of the openings 110a, 110b, and 110c, respectively, of the diaphragm. In other words, the transmission factor is distributed so as to be the highest at the centers of the diaphragm openings and so as to monotonically decrease toward the periphery.

Such a transmission factor distribution type filter is formed by forming a thin film of Inconel, Chromel, chromium or the like by vapor deposition or sputtering on the light incidence side of the objective lens 100. The characteristics shown in FIG. 9 can be obtained by making the thin film the thinnest at the center and the thickest on the periphery. It is to be noted that, in forming such a thin film, the position of a mask used in the vapor deposition or sputtering is continuously controlled.

Though the transmission factor distribution type filters 54a, 54b, and 54c are formed on the objective lens here, the structure may be that they are formed on a glass plate and are arranged on the light incidence side or the light projection side of the objective lens 100.

Figure 11:
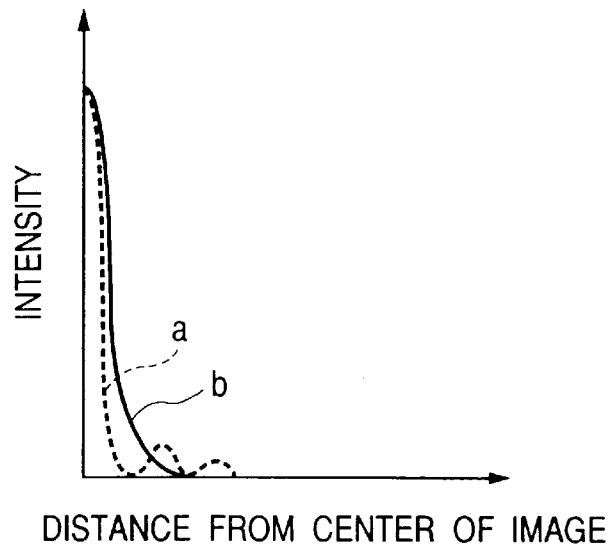
FIG. 11 is a graph showing the intensity distribution in an image by the image pickup system shown in FIG. 1.

FIG. 11 is a graph showing the intensity distribution in an image. In FIG. 11, a broken line a shows a case where the transmission factor is constant over the whole diaphragm opening, while a solid line b shows a case where the transmission factor is decreased from the center of the diaphragm opening toward the periphery. Compared with the case of the characteristics shown by a, there is no bound on the periphery of the image in the characteristics shown by b, which clearly shows that the image formed is satisfactory. Here, this reflects the technological advantage of decreasing the diffraction stripes by decreasing peripheral light beams by means of apodization.

Figure 12:
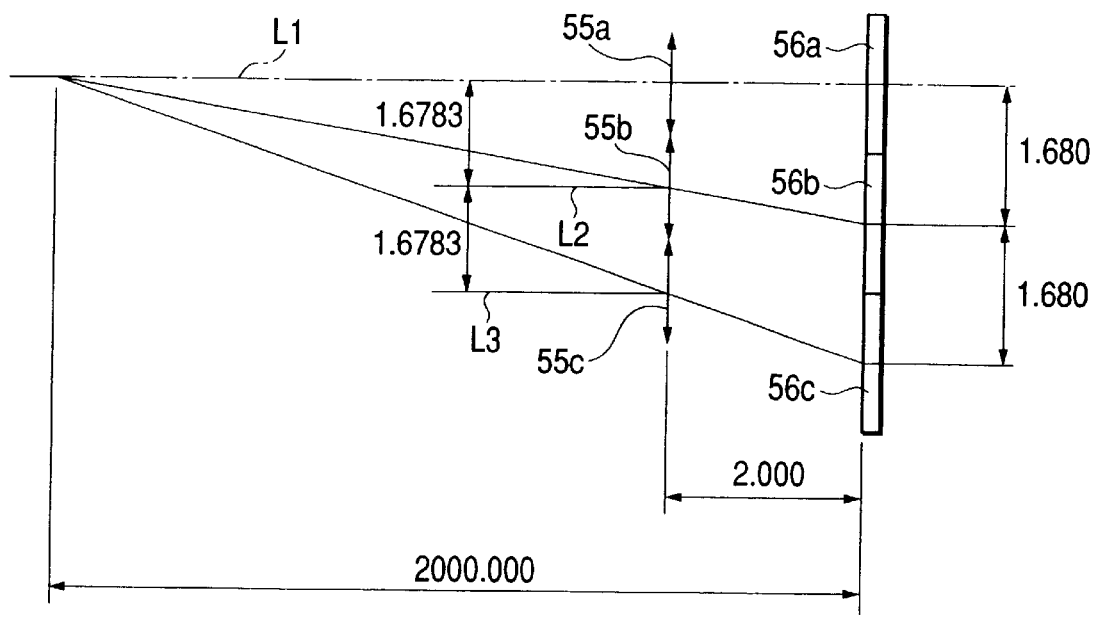
FIG. 12 is an explanatory view for explaining the setting of the intervals between lens portions of the image pickup system shown in FIG. 1.

Next, the relationship between the objective lens and the image pickup regions is described. Since the image pickup system has three lens portions, the positions of the three object images relatively change according to the distance to the subject. As described above, each of the image pickup regions is sized to be 2.24 mm×1.68 mm, and the image pickup regions are arranged adjacent to each other with their long sides being in contact with each other. Therefore, the center-to-center distance of adjoining image pickup regions is 1.68 mm. In the YC processing circuit 230, to be described later, signal processing is carried out on the assumption that the center of an object image is the center of the image pickup region. When an object image with the virtual object distance of 2 m is to be formed on the image pickup portion at the same intervals as that distance, as shown in FIG. 12, the interval between the lens portions 100a and 100b and between the lens portions 100b and 100c is set to be 1.6783 mm. In FIG. 12, arrows 55a, 55b, and 55c denote imaging systems having positive power by the three lens portions 100a, 100b, and 100c of the objective lens 100, respectively, rectangles 56a, 56b, and 56c denote the ranges of the image pickup regions 120a, 120b, and 120c, respectively, and L1, L2, and L3 are optical axes of the imaging systems 55a, 55b, and 55c, respectively. Since the light incidence surface of the objective lens 100 is a plane, and the lens portions 100a, 100b, and 100c which form the light projection surface are spherical surfaces, perpendicular lines from the respective centers of the spheres to the light incidence plane 100e define the optical axes.

Figure 13:
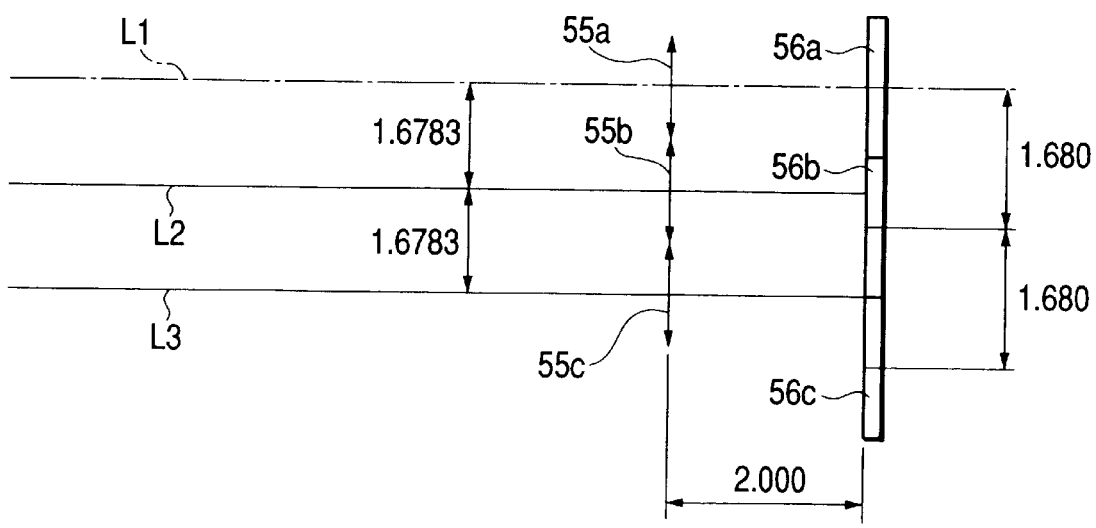
FIG. 13 is an explanatory view for explaining the positions of images of an object at infinity of the image pickup system shown in FIG. 1.

Here, as shown in FIG. 13, images of an object at infinity are formed at the same intervals as that of the lens portions 100a, 100b, and 100c, and thus, the interval between the G object image and the R object image and the interval between the R object image and the B object image are 1.6783 mm, which is a little smaller than the center-to-center distance of the image pickup regions of 1.68 mm. The difference $\Delta Y$ is 0.0017 mm, i.e., 1.7 $\mu$m. With the G object image, which has the highest luminosity factor, being the reference object image, when the B object image moves, the difference $\Delta Y$ is doubled and is 3.4 $\mu$m. Since it is often the case that a short-range object, such as a person, is positioned in the middle of a picture to be picked up, and that a long-range object is positioned on the periphery of the picture, and, since the aberration of the objective lens increases on the periphery of the picture so as to lower the quality of an image, it can be understood that practically no problem arises if the maximum image interval change is smaller than the pixel pitch multiplied by two. As described above, since the pixel pitch P of the solid-state image pickup element 120 is 2.8 $\mu$m, it follows that $\Delta Y < 2 \times P$, and thus, the color misalignment in an image at infinity to this extent is allowable.

Further, the interval between the images also varies according to a temperature change of the image pickup system 10. Since the imaging magnification of the image pickup system 10 is extremely small, the image interval variation $\Delta Z$ can be expressed as the difference between the expansion of the objective lens and the expansion of the solid-state image pickup element in the following equation (4):

$$Z = 1.68 \times (\alpha L - \alpha S) \times \Delta T \quad (4)$$

wherein $\alpha S$ is the coefficient of linear expansion of the solid-state image pickup element 120, $\alpha L$ is the coefficient of linear expansion of the objective lens 100, and $\Delta T$ is the temperature change.

Here, when $\alpha S = 0.26 \times 10^{-5}$, $\Delta T = 20[^\circ C.]$, and the objective lens 100 is formed of low-melting glass and $\alpha L = 1.2 \times 10^{-5}$, $\Delta Z$ is calculated at 0.00032[mm]. This is the variation in the interval between the G object image and the R object image and the variation in the interval between the R object image and the B object image.

When the B object image is regarded as a variation with respect to the G object image, which is the reference image signal, since the interval between the images is 1.68×2, the image interval variation is $\Delta Z \times 2 = 0.00063$[mm]. When the temperature range where the camera is used is 0 to 40° C., the deviation $\Delta T$ from the reference temperature of 20° C. is 20° C. Here, if $\Delta Z \times 2$ is smaller than ½ of the pixel pitch, practically no problem arises. Generally, the coefficient of linear expansion $\alpha S$ of the solid-state image pickup element 120 is as small as about $0.26 \times 10^{-5}$, and it is necessary to select the coefficient of linear expansion $\alpha L$ of the objective lens 100 so as to satisfy the following expression (5):

$$2 \times A \times (\alpha L - 0.26 \times 10^{-5}) \times 20 < \tfrac{1}{2} P \quad (5)$$

wherein A is either the interval between the G image and the R image or the interval between the R image and the B image and P is the pixel pitch.

Since the coefficient $\alpha L$ ($= 1.2 \times 10^{-5}$) of linear expansion of the objective lens 100 used above satisfies the relationship expressed by the expression (5), it can be understood that the material of the lens 100 is suitable for the camera.

Further, apart from the fluctuation of the image interval due to the distance to the object and due to temperature change, a method referred to as pixel shift is used where, by shifting relatively the image pickup regions 120a, 120b, and 120c of the solid-state image pickup element by ½ pixel, the resolution is made higher with a small number of pixels. The amount of the shift of ½ pixel is set with regard to the virtual object distance of 2 m.

Figure 15:
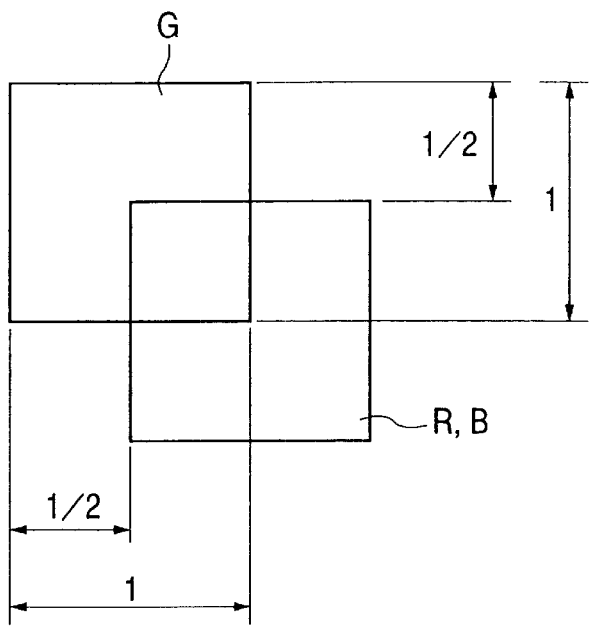
FIG. 15 illustrates the positional relationship of the image pickup region for R and B pixels with respect to the image pickup region for a G pixel of the image pickup system shown in FIG. 1.
Figure 16:
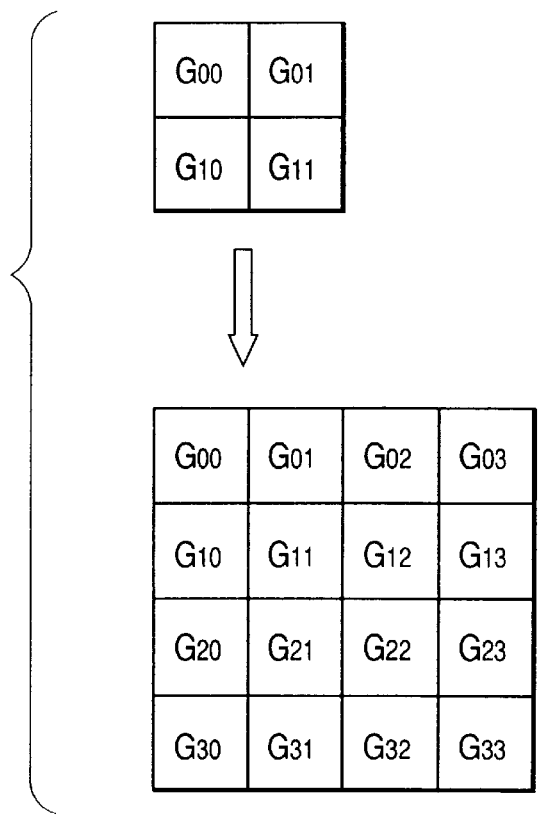
FIG. 16 is an explanatory view of interpolation processing of the digital color camera shown in FIG. 1.

As shown in FIG. 15, the image pickup region 120b for outputting the R image signals and the image pickup region 120c for outputting the B image signals are arranged so as to be shifted by ½ pixel both in the horizontal direction and in the vertical direction with respect to the image pickup region 120a for outputting the G image signals.

This pixel shift may be materialized by making the lens portions 100b and 100c of the objective lens 100 slightly offset with respect to the lens portion 100a, or may be materialized by making the image pickup regions 120b and 120c of the solid-state image pickup element 120 slightly offset with respect to the image pickup region 120a.

In an optical filter arrangement such as the Bayer arrangement, since, for example, a pixel provided with a red optical filter or a pixel provided with a blue optical filter is arranged between pixels provided with a green optical filter, an optical low-pass filter for suppressing aliasing is necessary. However, in a case in which images having different spectral distributions are taken in with regard to different image pickup regions, pixels provided with the respective optical filters can be densely arranged, and, as a result, the influence of the aliasing is small, and thus, a high definition image can be obtained without the need for an optical low-pass filter. This makes it possible to miniaturize the image pickup system and to substantially lower the cost.

Next, the signal processing is described.

As described above, an image pickup device having 1,800 pixels in its lengthwise direction and 800 pixels in its breadthwise direction, i.e., having 1,440,000 pixels in total, is effectively applied to the solid-state image pickup element 120. Optical filters of the three primary colors, that is, red (R), green (G), and blue (B), are arranged on its front surface in predetermined regions, respectively.

As shown in FIG. 14, image signals read from the solid-state image pickup element 120 are supplied to the A/D converter 500 of the image processing system 20. The A/D converter 500 is, for example, a signal converting circuit for converting the signals into digital signals of, for example, ten bits according to the amplitude of the signal of each pixel, and for outputting the converted signals. Then, the image signal processing is carried out in digital processing.

The image processing system 20 has a signal processing circuit for obtaining image signals of a desired format from R, G, and B digital signals, and converts the R, G, and B color signals into YC signals expressed by a luminance signal Y and chrominance signals (R-Y) and (B-Y) or the like.

The RGB image processing circuit 210 is a signal processing circuit for processing the pixel signals of the 1800×800 pixels received from the solid-state image pickup element 120 through the A/D converter 500, and has a white balance circuit, a gamma control circuit, and an interpolation circuit for making the resolution higher by interpolation.

The YC processing circuit 230 is a signal processing circuit for generating a luminance signal Y and chrominance signals R-Y and B-Y. The YC processing circuit 230 is formed of a high luminance signal generating circuit for generating a high luminance signal YH, a low luminance signal generating circuit for generating a low luminance signal YL, and a chrominance signal generating circuit for generating chrominance signals R-Y and B-Y. A luminance signal Y is formed by compositing a high luminance signal YH and a low luminance signal YL.

The RGB image processing circuit 210 is now described in detail.

RGB signals output through the A/D converter 500 with regard to the R, G, and B regions, respectively, are first subjected to predetermined white balance adjustment in the white balance circuit in the RGB image processing circuit 210, and then are subjected to predetermined gamma control in the gamma control circuit.

The interpolation circuit in the RGB image processing circuit 210 generates, by interpolation, image signals having a resolution which is four times as much as that of the 600×800 pixels, converts the image signals from the solid-state image pickup element 120 into signals having high definition image quality, and supplies them to the high luminance signal generating circuit, the low luminance signal generating circuit, and the chrominance signal generating circuit at the subsequent stage.

Since the sizes of the R, G, and B object images are already the same based on the setting of the objective lens 100, first, by a publicly known method, arithmetic processing for correcting optical aberration of the objective optical system is carried out with regard to the respective image signals. After that, the interpolation processing, the luminance signal processing, and the chrominance signal processing which are the same as those of an ordinary digital color camera are performed. The interpolation processing is as follows.

First, a G image signal, which is a reference image signal from the image pickup region 120a, is subjected to interpolation according to the following equations (6) to (9):

$$G2i2j = Gij \quad (6)$$

$$G2i(2j+1) = Gij \cdot \tfrac{1}{2} + Gi(j+1) \cdot \tfrac{1}{2} \quad (7)$$

$$G(2i+1)2j = Gij \cdot \tfrac{1}{2} + G(i+1)j \cdot \tfrac{1}{2} \quad (8)$$

$$G(2i+1)(2j+1) = Gij \cdot \tfrac{1}{4} + Gi(j+1) \cdot \tfrac{1}{4} + G(i+1)j \cdot \tfrac{1}{4} + G(i+1)(j+1) \cdot \tfrac{1}{4} \quad (9)$$

That is, 16 G elements are generated from each four G pixels, and thus the G image signals of 600×800 pixels from the image pickup region 120a are converted into 1200×1600 pixels.

Then, R image signals from the image pickup region 120b corresponding to the respective positions of the G image signals calculated using the above equations (6) to (9) are subjected to interpolation according to the following equations (10) to (13):

$$R2i2j = R(i-1)(j-1) \cdot \tfrac{1}{4} + R(i-1)j \cdot \tfrac{1}{4} + Ri(j-1) \cdot \tfrac{1}{4} + Rij \cdot \tfrac{1}{4} \quad (10)$$

$$R2i(2j+1) = R(i-1)j \cdot \tfrac{1}{2} + Rij \cdot \tfrac{1}{2} \quad (11)$$

$$R(2i+1)2j = Ri(j-1) \cdot \tfrac{1}{2} + Rij \cdot \tfrac{1}{2} \quad (12)$$

$$R(2i+1)(2j+1) = Rij \quad (13)$$

Since, as described above, the image pickup region of the R object image and the image pickup region of the B object image are arranged so as to be shifted by ½ pixel from the image pickup region of the G object image, the original output of the ij address is applied to the (2i+1)(2j+1) address as indicated by equation (13).

Similarly to the R image signals, B image signals from the image pickup region 120c corresponding to the respective positions of the G image signals calculated using the above equations (6) to (9) are subjected to interpolation according to the following equations (14) to (17):

$$B2i2j = B(i-1)(j-1) \cdot \tfrac{1}{4} + B(i-1)j \cdot \tfrac{1}{4} + Bi(j-1) \cdot \tfrac{1}{4} + Bij \cdot \tfrac{1}{4} \quad (14)$$

$$B2i(2j+1) = B(i-1)j \cdot \tfrac{1}{2} + Bij \cdot \tfrac{1}{2} \quad (15)$$

$$B(2i+1)2j = Bi(j-1) \cdot \tfrac{1}{2} + Bij \cdot \tfrac{1}{2} \quad (16)$$

$$B(2i+1)(2j+1) = Bij \quad (17)$$

By the above processing, the R, G, and B signals of 600×800 pixels from the image pickup regions 120a, 120b, and 120c are converted into R, G, and B signals of 1200× 1600 pixels having high definition image quality, respectively.

The high luminance signal generating circuit in the YC processing circuit 230 is a publicly known signal forming circuit for forming a high luminance signal YH from a color signal having the highest spatial frequency component among color component signals. The low luminance signal generating circuit is a publicly known signal forming circuit for forming luminance signal YL of low frequency from a signal containing all the color components of R, G, and B. The chrominance signal generating circuit is a publicly known arithmetic circuit for calculating chrominance signals R-Y and B-Y from high definition RGB signals.

The recording and reproduction system 30 is a processing system for outputting image signals to the memory and outputting image signals to the liquid crystal monitor 4, and includes a recording processing circuit 300 for writing and reading image signals into and from the memory and a reproduction processing circuit 310 for reproducing image signals read from the memory as output to the monitor. More specifically, the recording processing circuit 300 includes a compressing and expanding circuit for compressing YC signals representing a still image or a dynamic image according to a predetermined compression format and for expanding the compressed data when it is read from the memory. The compressing and expanding circuit includes a frame memory for signal processing and the like. YC signals from the image processing system 20 are stored on a frame-by-frame basis, the signals are read on a plurality of blocks basis, and the signals are compression encoded. The compression encoding is carried out by, for example, two-dimensional orthogonal transformation, normalization, and encoding according to the Huffman method on a block basis.

The reproduction processing circuit 310 is a circuit for carrying out matrix conversion of the luminance signal Y and the chrominance signals R-Y and B-Y into, for example, RGB signals. Signals converted by the reproduction processing circuit 310 are output to the liquid crystal monitor 4. Thus, a visible image is displayed and reproduced.

On the other hand, the control system 40 includes control circuits for controlling, in response to external operation, the image pickup system 10, the image processing system 20, and the recording and reproduction system 30, respectively. It detects depression of the RELEASE button 6 to control driving of the solid-state image pickup element 120, operation of the RGB image processing circuit 210, compression processing of the recording processing circuit 300, and the like. More specifically, the control system 40 includes an operation detection circuit 410 for detecting the operation of the RELEASE button 6, a system control unit 400 for controlling the respective portions in response to the detection signal and generating and outputting timing signals when an image is picked up and the like, and a drive circuit 420 for the solid-state image pickup element 120, which, under control of the system control unit 400, generates drive signals for driving the solid-state image pickup element 120.

Next, operation of the image pickup apparatus according to the present embodiment is described with reference to FIGS. 14 and 17A to 17C. First, when the main switch 5 is turned on, power source voltage is supplied to the respective portions and then they become operable. Then, it is determined whether an image signal can be recorded or not in the memory. Here, the number of recordable pictures is displayed on the display area 13 for the remaining number of pictures in a liquid crystal monitor 4 according to the remaining capacity. An operator sees the display and, if a picture is recordable, directs the camera to the field and presses down the RELEASE button 6.

When the RELEASE button 6 is pressed halfway down, the exposure time is calculated. When all the preparatory processing for taking a picture is completed, the camera is in a recordable state, and the operator is informed of this through the display. When the RELEASE button 6 is pressed down fully, the operation detection circuit 410 transmits the detection signal to the system control unit 400. Here, the exposure time calculated in advance is counted. When the predetermined exposure time has elapsed, a timing signal is supplied to the drive circuit 420. Then, the drive circuit 420 generates horizontal and vertical drive signals to sequentially read each of the exposed 1600×800 pixels in the horizontal direction and in the vertical direction.

The read signals of respective pixels are converted by the A/D converter 500 into digital signals of a predetermined number of bits to be sequentially supplied to the RGB image processing circuit 210 of the image processing system 20. The RGB image processing circuit 210 carries out interpolation to quadruple the pixel resolution after white balance adjustment and gamma control, and supplies the signals to the YC processing circuit 230.

In the YC processing circuit 230, the high luminance signal generating circuit generates high luminance signal YH with regard to the respective RGB pixels, and similarly, the low luminance signal generating circuit generates low luminance signal YL. The calculated high luminance signal YH is output to an adder through a low-pass filter. In the same way, the low luminance signal YL is, after subtraction of the high luminance signal YH, output to the adder through the low pass filter. In this manner, the difference YL-YH between a high luminance signal and a low luminance signal is added to obtain an luminance signal Y. Similarly, the chrominance signal generating circuit generates and outputs chrominance signals R-Y and B-Y. Components of the output chrominance signals R-Y and B-Y, which come through the low-pass filter, are supplied to the recording processing circuit 300.

Next, the recording processing circuit 300 receives the YC signals, compresses the respective luminance signal Y and chrominance signals R-Y and B-Y with a predetermined still image compression method, and records them sequentially in the memory.

In order to reproduce a still image or a dynamic image from image signals stored in the memory, the PLAY button 9 is pressed down. Then, the operation detection circuit 410 detects this operation to supply a detection signal to the system control unit 400, which causes the recording processing circuit 300 to be driven. The driven recording processing circuit 300 reads the recorded content from the memory so as to display images on the liquid crystal monitor 4. The operator selects the desired image by pressing down a SELECT button or the like.

Figure 18:
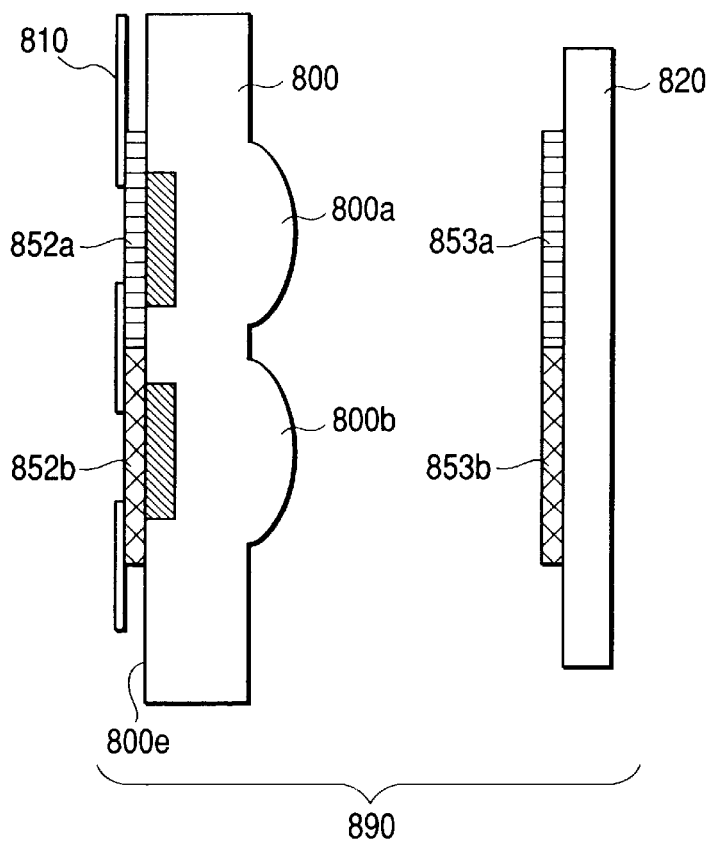
FIG. 18 is a detailed view of an image pickup system of a digital color camera according to a second embodiment of the present invention.
Figure 21:
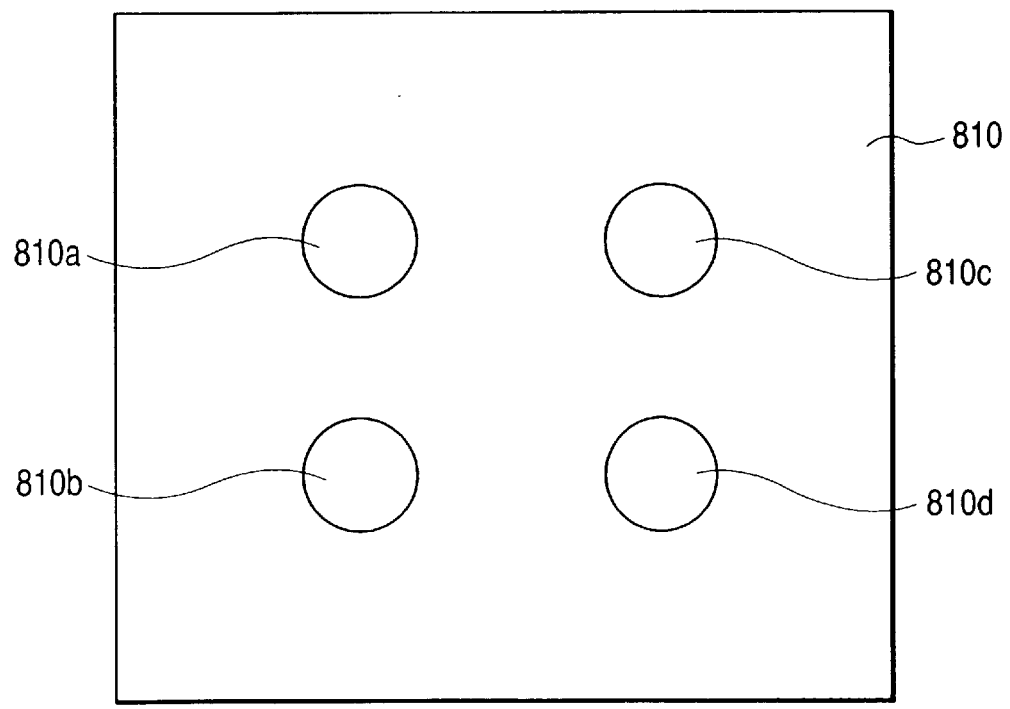
FIG. 21 is a plan view of a diaphragm of the image pickup system shown in FIG. 18.

In a second embodiment of the present invention, an image pickup system is different from that of the first embodiment in the positional relationship in the objective lens and in the image pickup regions. FIG. 18 is a detailed view of an image pickup system 890. First, the diaphragm 810 has four circular openings 810a, 810b, 810c, and 810d as shown in FIG. 21. Object light which enters a light incidence plane 800e of an objective lens 800 from the openings are projected from four lens portions 800a, 800b, 800c, and 800d of the objective lens 800 to form four object images on the image pickup plane of a solid-state image pickup element 820. The diaphragm 810, the light incidence plane 800e, and the image pickup plane of the solid-state image pickup element 820 are parallel with one another. Though the light incidence plane 800e of the objective lens 800 is a plane here, the light incidence plane 800e may be formed as four spherical surfaces or four rotation-symmetry nonspherical surfaces.

Figure 20:
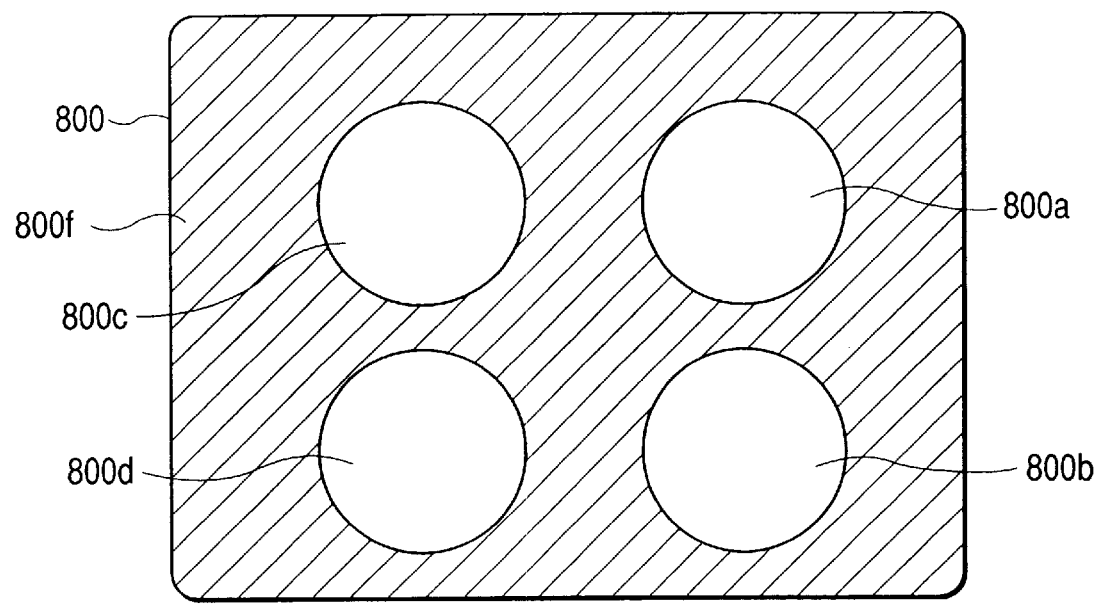
FIG. 20 illustrates the objective lens of the image pickup system shown in FIG. 19 which is viewed from the side where light is projected.

The four lens portions 800a, 800b, 800c, and 800d have circular spherical surface portions as shown in FIG. 20, which shows the objective lens 800 viewed from the side where light is projected. An infrared radiation cutting filter having a low transmission factor with regard to the wavelength range of 670 nm and more is formed on the spherical surface portions while a light-shielding layer is formed on a plane portion 800f shown with hatching. More specifically, the objective optical system is formed with the objective lens 800 and the diaphragm 810, while the four lens portions 800a, 800b, 800c, and 800d are the imaging system.

Figure 22:
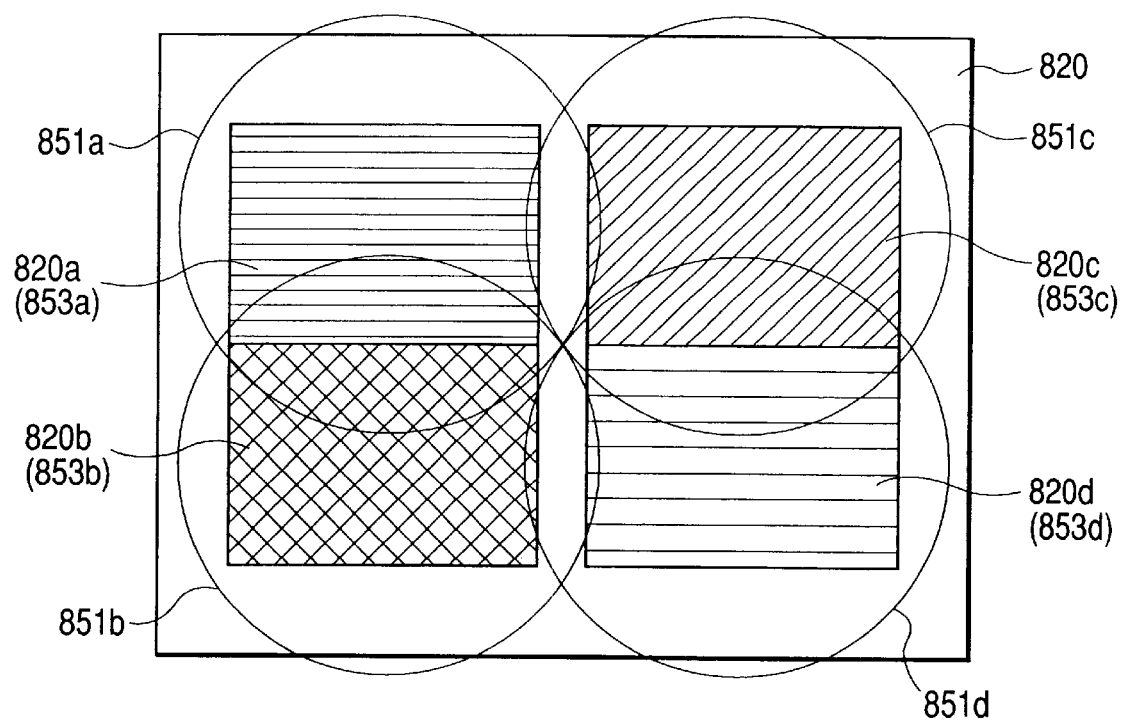
FIG. 22 is a front view of a solid-state image pickup element 820 of the image pickup system shown in FIG. 18.

FIG. 22 is a front view of the solid-state image pickup element 820. The solid-state image pickup element 820 is provided with four image pickup regions 820a, 820b, 820c, and 820d corresponding to the formed four object images. Each of the image pickup regions 820a, 820b, 820c, and 820d is sized to be 2.24 mm×1.68 mm with the arrangement of 800×600 pixels having the vertical and horizontal pitch of 2.8 $\mu$m. The size of the overall image pickup region is 4.78 mm×3.36 mm, including an image pickup region separator of 0.3 mm in the middle. The diagonal size of each of the image pickup regions is 2.80 mm. In this figure, image circles 851a, 851b, 851c, and 851d within which an object image is formed are circular the sizes of which are determined based on the openings of the diaphragm and the size of the spherical surface portions on the projection side of the objective lens 800. The image circles 851a, 851b, 851c, and 851d overlap one another.

Figure 19:
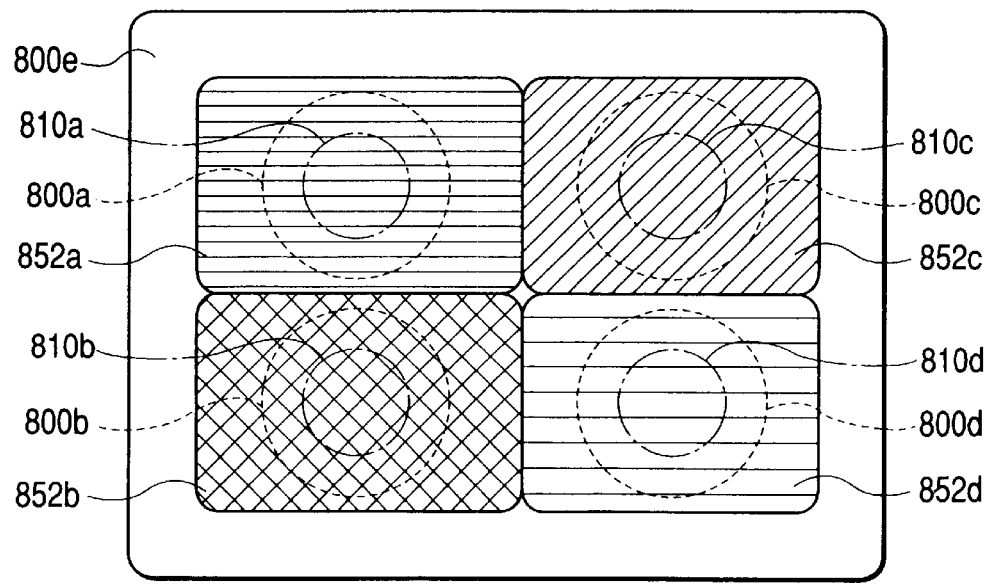
FIG. 19 illustrates an objective lens of the image pickup system shown in FIG. 18 which is viewed from the side where light enters.

In FIG. 18, hatched portions 852a and 852b sandwiched between the diaphragm 810 and the objective lens 800 are optical filters formed on the light incidence plane 800e of the objective lens 800. As shown in FIG. 19, which shows the objective lens 800 viewed from the light incidence side, the optical filters 852a, 852b, 852c, and 852d are formed in regions which completely include the diaphragm openings 810a, 810b, 810c, and 810d, respectively.

The optical filters 852a and 852d have spectral transmission factor characteristics shown as G in FIG. 6, which mainly transmit green, the optical filter 852b has spectral transmission factor characteristics shown as R, which mainly transmit red, and the optical filter 852c has spectral transmission factor characteristics shown as B, which mainly transmit blue, and thus, these are primary color filters. As the product with the characteristics of the infrared radiation cutting filter formed on the lens portions 800a, 800b, 800c, and 800d, the object images formed in the image circles 851a and 851d are of green light component, the object image formed in the image circle 851b is of red light component, and the object image formed in the image circle 851c is of blue light component.

On the other hand, optical filters 853a, 853b, 853c, and 853d are formed on the four image pickup regions 820a, 820b, 820c, and 820d, respectively, of the solid-state image pickup element 820. Their spectral transmission factor characteristics are equivalent to the ones shown in FIG. 6. More specifically, the image pickup regions 820a and 820d are sensitive to green light (G), the image pickup region 820b is sensitive to red light (R), and the image pickup region 820c is sensitive to blue light (B).

Since the spectral distributions of the received light of the respective image pickup regions are given as the product of the spectral transmission factors of the pupils and the spectral transmission factors of the image pickup regions, respectively, the combination of the pupil and the image pickup region is selected according to the wavelength range. More specifically, object light which goes through the diaphragm opening 810a is mainly photoelectrically converted in the image pickup region 820a, object light which goes through the diaphragm opening 810b is mainly photoelectrically converted in the image pickup region 820b, object light which goes through the diaphragm opening 810c is mainly photoelectrically converted in the image pickup region 820c, and object light which goes through the diaphragm opening 810d is mainly photoelectrically converted in the image pickup region 820*d*. In other words, the image pickup regions 820*a* and 820*d* output G images, the image pickup region 820*b* outputs an R image, and the image pickup region 820*c* outputs a B image, respectively. In this way, by using multiple optical filters for the purpose of color separation on the pupils of the image pickup optical system and on the image pickup element, the color purity can be enhanced.

It is to be noted that the separator between the image pickup regions is provided for the purpose of preventing overlap of the image circles in the image pickup regions 820*a* and 820*d*, since both of them obtain G image signals.

In the image processing system 20, a color image is formed based on the photoelectric conversion output of one of the plurality of images obtained in the plurality of image pickup regions of the solid-state image pickup element 820. Here, since the peak wavelength of the spectral luminous efficiency is 555 nm, the signal processing is carried out with a G image signal including this wavelength being as the reference image signal. Since a G object image is formed both in the image pickup region 820*a* and in the image pickup region 820*d*, the number of pixels of the G object image is twice as much as that of the R object image or the B object image, and thus, a particularly high definition image can be obtained in the wavelength range having the highest luminosity factor.

It is to be noted that, here, apart from the fluctuation of the image interval due to the distance to the object and temperature change, which is described in the following, the method referred to as pixel shift is used where, by shifting relatively the image pickup regions 820*a* and 820*d* of the solid-state image pickup element by ½ pixel, the resolution is made higher with a small number of pixels. The amount of the shift of ½ pixel is set with regard to the virtual object distance 2 m.

This pixel shift may be materialized by making the lens portion 800*d* of the objective lens 800 slightly offset with respect to the lens portion 800*a*, or may be materialized by making the image pickup region 820*d* of the solid-state image pickup element 820 slightly offset with respect to the image pickup region 820*a*.

Since the image pickup system has four lens portions, the positions of the four object images relatively change according to the distance to the object. As described above, each of the image pickup regions is sized to be 2.24 mm×1.68 mm, and each two of them are arranged adjacent to each other with their longer sides being in contact with each other. The two pairs are in parallel with each other with the separator of 0.3 mm therebetween. Therefore, the center-to-center distance of adjoining image pickup regions is 1.68 mm in the vertical direction and 2.54 mm in the horizontal direction. The distance between image pickup regions is longest with regard to the image pickup regions 820*a* and 820*d*, and with regard to the image pickup regions 820*b* and 820*c*, which are positioned obliquely with respect to each other. This longest distance is 3.045 mm in both cases.

Figure 23:
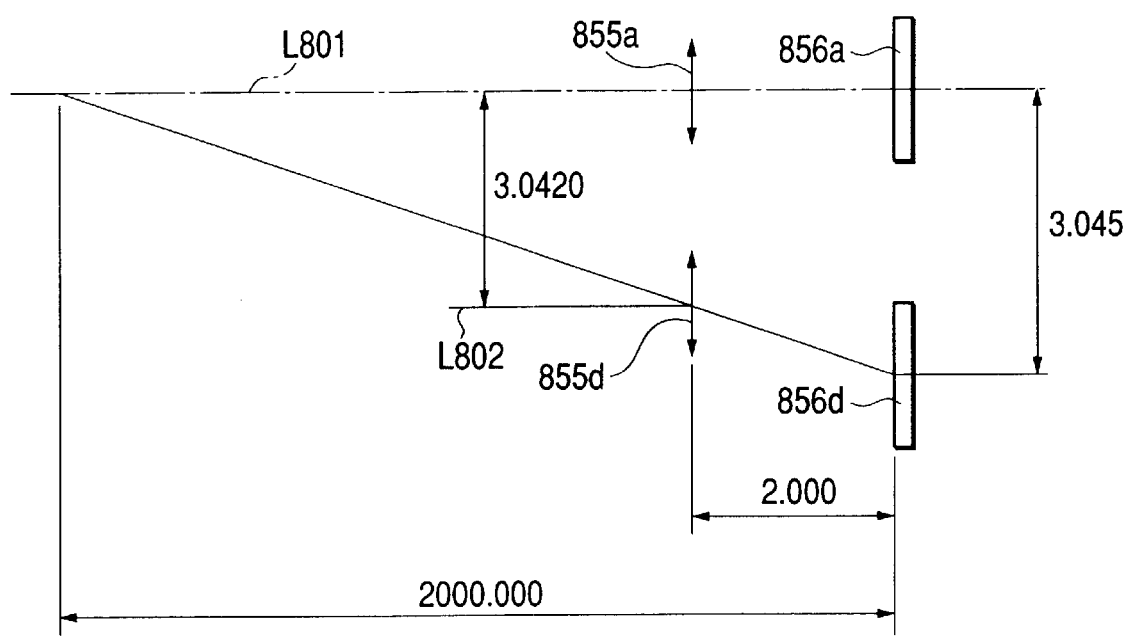
FIG. 23 is an explanatory view for explaining the setting of the intervals between lens portions of the image pickup system shown in FIG. 18.

In the YC processing circuit 230 to be described later, signal processing is carried out on the assumption that the center of an object image is the center of the image pickup region. With regard to the image pickup regions 820*a* and 820*d*, in the case that object images with a virtual object distance 2 m are to be formed on the image pickup portion so as to keep the interval of 3.045 mm, which is the same as the interval between the image pickup regions, as shown in FIG. 23, the interval between the lens portions 800*a* and 800*d* of the objective lens 800 is set to be 3.0420 mm. In FIG. 23, arrows 855*a* and 855*d* denote imaging systems having positive power by the lens portions 800*a* and 800*d* of the objective lens 800, respectively, rectangles 856*a* and 856*d* denote the ranges of the image pickup regions 820*a* and 820*d*, respectively, and L801 and L802 are optical axes of the imaging systems 855*a* and 855*d*, respectively. Since the light incidence surface 800*e* of the objective lens 800 is a plane and the lens portions 800*a* and 800*d*, which are the light projection surfaces, are spherical surfaces, lines extending perpendicular from the respective centers of the spheres to the light incidence plane are the optical axes.

Figure 24:
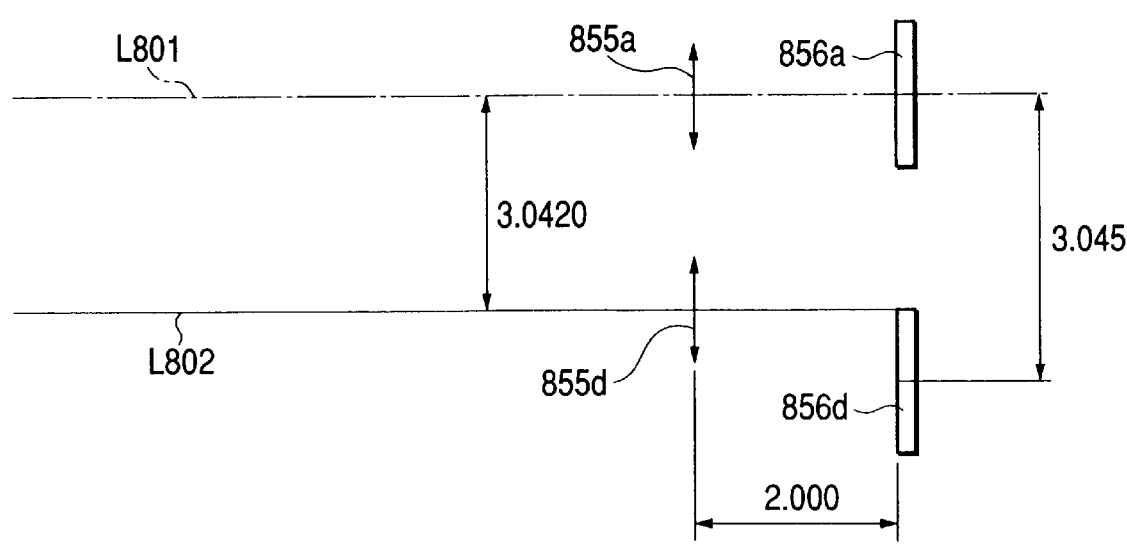
FIG. 24 is an explanatory view for explaining the position of an image of an object located at infinity of the image pickup system shown in FIG. 18.

Here, as shown in FIG. 24, images of an object at infinity are formed at the same intervals as that of the lens portions 800*a* and 800*d*, and thus, the interval between the G object images is 3.0420 mm, which is a little smaller than the center-to-center distance of the image pickup regions of 3.045 mm. The difference $\Delta Y$ is 0.0030 mm, i.e., 3.0 $\mu$m. Such fluctuation in the interval between the G object images appears as a decrease in the resolution.

With regard to the image pickup regions 820*b* and 820*c*, similarly, $\Delta Y$ is 3.0 $\mu$m and, thus, color misalignment by this amount is caused with regard to an image located at infinity. Therefore, two problems have to be considered: fluctuation in the interval between the G object images, and misalignment of the R object image and the B object image.

However, since the spectral luminous efficiency is high with regard to a G object image, and thus the G object image can be recognizable even with a slight decrease in its resolution, first, the fluctuation in the interval between the G object images is considered. If such an interval is allowable, it can be understood that the misalignment of the R object image and the B object image causes no problem.

Since, generally, it is often the case that a short-range object, such as a person, is positioned in the middle of a picture to be picked up, and that a long-range object is positioned on the periphery of the picture, and, since aberration of an objective lens increased on the periphery of the picture so as to lower the quality of an image, there is practically no problem, if the maximum image interval change between the G object images is smaller than the pixel pitch multiplied by two. Since the pixel pitch P of the solid-state image pickup element 820 is 2.8 $\mu$m, it follows that $\Delta Y < 2 \times P$, and thus, the color misalignment in an image at infinity to this extent is allowable.

It follows that the misalignment of the R object image and the B object image is also allowable, and thus, it can be understood that this image pickup system has practically sufficient performance.

The individual components shown in schematic or block form in the drawings are all well-known in the camera arts and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

For example, in the described embodiments, optical filters used for the color separation are primary color filters of red, green, and blue. However, the present invention is also applicable to a case where these filters are replaced by complementary color filters of cyan, magenta, and yellow.

Further, in the above embodiments, an object image having the highest luminosity factor (green) is used as a reference to describe change in the intervals between the object image having the highest luminosity factor and object images having other luminosity factors (other colors), which are caused by a change in the distance to the object. However, the present invention is also applicable to a case where an object image having other than the highest luminosity factor (green) is used as a reference.

It is to be noted that, in the present invention, the respective embodiments in the above or technical elements thereof may be freely combined depending on the situation.

Also, in the present invention, the whole or part of the appended claims or of the structure of an embodiment may form one apparatus, may be combined with another apparatus, or may be an element of an apparatus.

What is claimed is:

1. An image pickup apparatus comprising:
   a plurality of openings for taking in external light at different positions;
   a filter for extracting from external light taken in from the plurality of openings, predetermined wavelength components of object light correspondingly to said plurality of openings, respectively;
   a plurality of image pickup portions for receiving the predetermined wavelength components extracted by said filter correspondingly to the plurality of openings, respectively; and
   a plurality of optical systems for guiding the predetermined wavelength components extracted by said filter to the corresponding image pickup portions, respectively,
   wherein, when a virtual object distance D [m] is defined as a function of an image pickup angle θ [°] of said plurality of optical systems to be D=1.4/tan (θ/2), an interval between optical axes of said plurality of optical systems is set such that change in an interval between an object image received by a first image pickup portion which is one of said plurality of image pickup portions and an object image received by a second image pickup portion which is another one of said plurality of image pickup portions between when an object exists at the virtual object distance and when the object exists at infinity is smaller than a pixel pitch of said plurality of image pickup portions multiplied by two.

2. An image pickup apparatus according to claim 1, wherein each of said plurality of optical systems comprises a single lens.

3. An image pickup apparatus according to claim 2, wherein a plurality of single lenses of said plurality of optical systems are integrally formed of a glass material or a resin material.

4. An image pickup apparatus according to claim 3, further comprising:
   a light-shielding layer provided between said plurality of single lenses which are integrally formed.

5. An image pickup apparatus according to claim 1, wherein each of said plurality of optical systems comprises a single lens provided with an infrared radiation cutting filter.

6. An image pickup apparatus according to claim 1, wherein each of said plurality of optical systems comprises photochromic glass.

7. An image pickup apparatus according to claim 1, wherein each of said plurality of optical systems comprises a color purity correction filter.

8. An image pickup apparatus according to claim 1, wherein each of said plurality of optical systems comprises a filter whose transmission factor becomes smaller as the distance from an optical axis thereof becomes longer.

9. An image pickup apparatus according to claim 1, wherein the predetermined wavelength component received by said first image pickup portion is green, and the predetermined wavelength component received by said second image pickup portion is at least one of red and blue.

10. An image pickup apparatus according to claim 1, wherein the predetermined wavelength component received by said first image pickup portion is a wavelength component having the highest luminosity factor and the predetermined wavelength component received by said second image pickup portion is a wavelength component having a luminosity factor different from the highest luminosity factor.

11. An image pickup apparatus according to claim 1, wherein the predetermined wavelength components received by said first and second image pickup portions are the same wavelength component.

12. An image pickup apparatus according to claim 1, wherein the predetermined wavelength components received by said first and second image pickup portions are green.

13. An image pickup apparatus according to claim 1, wherein the predetermined wavelength components received by said first and second image pickup portions are the wavelength component having the highest luminosity factor.

14. An image pickup apparatus according to claim 1, wherein said plurality of image pickup portions are integrally formed.

15. An image pickup apparatus according to claim 1, wherein said plurality of image pickup portions are formed in a plane shape.

16. An image pickup apparatus according to claim 1, wherein said filter comprises an optical filter for transmitting red light, an optical filter for transmitting green light, and an optical filter for transmitting blue light correspondingly to said plurality of openings, respectively.

17. An image pickup apparatus according to claim 16, wherein said filter comprises a plurality of optical filters provided such that a same color light transmits through each one of said plurality of openings to each one of said plurality of image pickup portions corresponding to said each one of said plurality of openings.

18. An image pickup apparatus according to claim 16, wherein said plurality of openings are arranged so as to arrange two in a vertical direction and two in a horizontal direction, and said optical filter for transmitting green light is provided correspondingly to two of said plurality of openings.

19. An image pickup apparatus according to claim 1, wherein said filter comprises an optical filter for transmitting cyan light, an optical filter for transmitting magenta light, and an optical filter for transmitting yellow light correspondingly to said plurality of openings, respectively.

20. An image pickup apparatus comprising:
   a plurality of image pickup portions for receiving different wavelength components of object light, respectively, said plurality of image pickup portions being formed in a plane shape; and
   a plurality of optical systems for guiding object light to said plurality of image pickup portions, respectively, said plurality of optical systems setting, when a virtual object distance D [m] is defined as a function of an image pickup angle θ [°] of said optical systems to be D=1.4/tan (θ/2), an interval between optical axes of said plurality of optical systems such that change in an interval between an object image received by a first image pickup portion which is one of said plurality of image pickup portions and an object image received by a second image pickup portion which is another one of said plurality of image pickup portions between when an object exists at the virtual distance and when the object exists at infinity is smaller than a pixel pitch of said plurality of image pickup portions multiplied by two.

* * * * *